US010636372B2

(12) United States Patent
    Wang

(10) Patent No.: US 10,636,372 B2
(45) Date of Patent: Apr. 28, 2020

(54) SHIFT REGISTER, GATE DRIVER, AND DRIVING METHOD OF SHIFT REGISTER

(71) Applicants: BOE TECHNOLOGY GROUP CO., LTD., Beijing (CN); Ordos Yuansheng Optoelectronics Co., Ltd., Ordos, Inner Mongolia (CN)

(72) Inventor: Jiguo Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/752,518

(22) PCT Filed: Aug. 4, 2017

(86) PCT No.: PCT/CN2017/096009
§ 371 (c)(1),
(2) Date: Feb. 13, 2018

(87) PCT Pub. No.: WO2018/133382
PCT Pub. Date: Jul. 26, 2018

(65) Prior Publication Data
US 2019/0012973 A1     Jan. 10, 2019

(51) Int. Cl.
    G09G 3/36      (2006.01)
    G11C 19/18     (2006.01)
    G11C 19/28     (2006.01)
    G06F 3/041     (2006.01)

(52) U.S. Cl.
    CPC ......... G09G 3/3648 (2013.01); G06F 3/0412
    (2013.01); G06F 3/0416 (2013.01);
    (Continued)

(58) Field of Classification Search
    CPC ...... G06F 3/041; G06F 3/0412; G06F 3/0416;
            G09G 2300/0408; G09G 2310/0267;
    (Continued)

(56) References Cited

U.S. PATENT DOCUMENTS 9,286,846 B2 * 3/2016 Yu ........................ G09G 3/3648
9,972,238 B2 * 5/2018 Li ............................ G09G 3/20
(Continued)

FOREIGN PATENT DOCUMENTS

CN    20080051637 A    6/2008
CN      103226981 A    7/2013
(Continued)

OTHER PUBLICATIONS

International Search Report and English Translation of Written Opinion, for PCT Patent Application No. PCT/CN2017/096009, dated Oct. 23, 2017, 17 pages.
(Continued)

Primary Examiner — Dmitriy Bolotin
(74) Attorney, Agent, or Firm — Kinney & Lange, P.A.

(57) ABSTRACT

The present disclosure discloses a shift register, comprising: a first capacitor with a first terminal connected to a first pull-up node and a second terminal connected to a second pull-up node; a first thin-film transistor with a gate connected to the first pull-up node, a first electrode connected to the second pull-up node and a second electrode connected to a first clock signal input terminal; a second thin-film transistor with a gate connected to the second pull-up node, a first electrode connected to an output of the shift register, and a second electrode connected to a DC high level signal terminal; and an input control circuit The first capacitor, the first capacitor and the first thin-film transistor boost the
(Continued)

voltage on the first pull-up node so as to make a clock signal inputted from the first clock signal input terminal pass to the second pull-up node.

16 Claims, 4 Drawing Sheets

(52) U.S. Cl.
CPC .......... *G09G 3/3677* (2013.01); *G11C 19/184* (2013.01); *G11C 19/28* (2013.01); *G06F 3/041* (2013.01); *G09G 2300/0408* (2013.01); *G09G 2310/0267* (2013.01); *G09G 2310/0286* (2013.01); *G09G 2330/021* (2013.01)

(58) Field of Classification Search
CPC ..... G09G 2310/0286; G09G 2330/021; G09G 3/3648; G09G 3/3677; G11C 19/28; G11C 19/184
See application file for complete search history.

(56) References Cited

U.S. PATENT DOCUMENTS

| | | | |
|---|---|---|---|
| 2010/0166136 A1 | 7/2010 | Tobita | |
| 2014/0111403 A1* | 4/2014 | Kim | G11C 19/28 345/76 |
| 2015/0109353 A1* | 4/2015 | Yu | G11C 19/28 345/691 |
| 2015/0302934 A1 | 10/2015 | Qi et al. | |
| 2016/0268004 A1 | 9/2016 | Li et al. | |
| 2017/0039968 A1* | 2/2017 | Chen | G09G 3/3648 |
| 2017/0169778 A1* | 6/2017 | Mei | G09G 3/3648 |
| 2017/0178558 A1* | 6/2017 | Zhou | G09G 3/20 |
| 2017/0193889 A1* | 7/2017 | Li | G09G 3/20 |
| 2017/0309240 A1* | 10/2017 | Zhang | G09G 3/36 |
| 2018/0211628 A1* | 7/2018 | Du | G09G 3/3677 |
| 2018/0226132 A1* | 8/2018 | Gao | G09G 3/3677 |

FOREIGN PATENT DOCUMENTS

| | | |
|---|---|---|
| CN | 103996367 A | 8/2014 |
| CN | 104966500 A | 10/2015 |
| CN | 105761758 A | 7/2016 |
| CN | 105810170 A | 7/2016 |
| CN | 106251818 A | 12/2016 |
| CN | 106814911 A | 6/2017 |

OTHER PUBLICATIONS

First Chinese Office Action dated Mar. 1, 2019, received for corresponding Chinese Application No. 201710034742.X.

* cited by examiner

SHIFT REGISTER, GATE DRIVER, AND DRIVING METHOD OF SHIFT REGISTER

CROSS-REFERENCE TO RELATED APPLICATION(S)

This application is a U.S. National Phase Application of International Application No. PCT/CN2017/096009, filed on Aug. 4, 2017, entitled "TOUCH SENSING ELECTRONIC DEVICE, TOUCH SENSING DISPLAY DEVICE AND GATE DRIVER ON ARRAY," which claims priority to Chinese Application No. 201710034742.X, filed on Jan. 18, 2017, both of which are incorporated herein by reference in their entirety.

TECHNICAL FIELD

The present disclosure relates to the field of display control technology, and in particular, to a shift register, a gate driver and a driving method of the shift register.

BACKGROUND

Stability, low power consumption and low cost are concerned in the LCD panel industry. In recent years, as the size of the LCD panel becomes larger and larger, the integration level becomes higher and higher, the circuit structure becomes more and more complex, and the need for reducing the power consumption and increasing the system stability becomes even more urgent. Therefore, low power consumption and stability have become the focus of attention in the field of GOA (Gate Driver on Array) technology in recent years, and GOA's performance directly affects the reliability and stability of the entire display system, and thus affects the display effect of the panel display.

SUMMARY

A first object of the present disclosure is to provide a shift register, which has significantly improved capability to drive a circuit.

In order to achieve the above objects, a shift register, according to an embodiment of a first aspect of the present disclosure comprises: a first capacitor with a first terminal connected to a first pull-up node and a second terminal connected to a second pull-up node; a first thin-film transistor with a gate connected to the first pull-up node, a first electrode connected to the second pull-up node, and a second electrode connected to a first clock signal input terminal; a second thin-film transistor with a gate connected to the second pull-up node, a first electrode connected to an output of the shift register, and a second electrode connected to a DC high level signal terminal; and an input control circuit connected to a signal input terminal and a signal control terminal, which controls a voltage level of the first terminal of the first capacitor under the control of an input signal inputted from the signal input terminal and a control signal inputted from the signal control terminal, thereby the first capacitor and the first thin-film transistor boost the voltage on the first pull-up node so as to make a clock signal inputted from the first clock signal input terminal pass to the second pull-up node, and enable a high level signal inputted from the DC high level signal terminal control the output of the shift register via the second thin-film transistor when the voltage level of the first terminal of the first capacitor is a turn-on voltage level.

According to an embodiment of the present disclosure, the shift register further comprises: a second capacitor with a first terminal connected to a first pull-down node and a second terminal connected to a DC low level signal terminal; a third thin-film transistor with a first electrode connected to the first pull-down node, and a gate and a second electrode connected with each other and to a second clock signal input terminal; a fourth thin-film transistor with a gate connected to the first pull-down node, a first electrode connected to the DC low level signal terminal, and a second electrode connected to the first pull-up node; a fifth thin-film transistor with a first electrode connected to the DC low level signal terminal and a second electrode connected to the first electrode of the second thin-film transistor; a potential-stabilizing unit with a first input terminal connected to the first pull-down node, a second input terminal connected to the first pull-up node, and an output terminal connected to a gate of the fifth thin-film transistor and used as a second pull-down node. The potential-stabilizing unit is configured to enable, according to the potential of the first pull-down node and the potential of the first pull-up node, the second pull-down node to output a more stable potential than that output by the first pull-down node, so as to control the output of the shift register via the fifth thin-film transistor.

According to an embodiment of the present disclosure, the potential-stabilizing unit comprises: a sixth thin-film transistor with a first electrode connected to the second pull-down node, and a gate and a second electrode connected with each other and connected to a first input terminal of the potential-stabilizing unit; a seventh thin-film transistor with a gate used as a second input terminal of the potential-stabilizing unit, a first electrode connected to a DC low level signal terminal, and a second electrode connected to the second pull-down node; a third capacitor with a first terminal connected to the second pull-down node and a second terminal connected to the DC low level signal terminal.

According to an embodiment of the present disclosure, the input control circuit comprises: an eighth thin-film transistor with a gate connected to the first signal input terminal, a first electrode connected to the first pull-up node, and a second electrode connected to a first signal control terminal, and configured to charge the first capacitor under control of the input signal inputted from the first signal input terminal and the control signal inputted from the first signal control terminal; a ninth thin-film transistor with a gate connected to a second signal input terminal, a first electrode connected to a second signal control terminal, and a second electrode connected to the first pull-up electrode and the first electrode of the eighth thin-film transistor, and configured to pull down the first pull-down node to a low level under control of the input signal inputted from the second signal input terminal and the control signal inputted from the second signal control terminal.

According to an embodiment of the present disclosure, when the control signal inputted from the first signal control terminal is at a high level and the control signal inputted from the second signal control terminal is at a low level, the shift register performs forward scan, while when the control signal inputted from the first signal control terminal is at a low level and the control signal inputted from the second signal control terminal is at a high level, the shift register performs reverse scan.

According to an embodiment of the present disclosure, the shift register further comprises: a tenth thin-film transistor with a gate connected to the first pull-up node, a first electrode connected to the DC low level signal terminal, and a second electrode connected to the first pull-down node; an eleventh thin-film transistor with a gate connected to the first pull-down node, a first electrode connected to the DC low level signal terminal, and a second electrode connected to the second pull-up node.

According to an embodiment of the present disclosure, when the clock signal inputted from the first clock signal input terminal is at a high level, the clock signal inputted from the second clock signal input terminal is at a low level, while when the clock signal inputted from the second clock signal input terminal is at a high level, the clock signal inputted from the first clock signal input terminal is at a low level.

According to an embodiment of the present disclosure, in the case that the control signal inputted from the first signal control terminal is at a high level and the control signal inputted from the second signal control terminal is at a low level, when the input signal inputted from the first signal input terminal is at a high level, the clock signal inputted from the first clock signal input terminal is at a low level and the clock signal inputted from the second clock signal input terminal is at a high level, the first pull-up node becomes to be at a high level, the first thin-film transistor is turned on, the second pull-up node and the clock signal inputted from the first clock signal input terminal remain at a low level, the second thin-film transistor is turned off, the output of the shift register remains at a low level, and the tenth thin-film transistor is turned on, the first pull-down node is connected to the DC low level signal terminal, the second capacitor is discharged, the potential of the first pull-down node is pull down to a low level, the eleventh thin-film transistor is turned off, the seventh thin-film transistor is turned on, the second pull-down node is connected to the DC low level signal terminal, the third capacitor is discharged, the potential of the second pull-down node is pull down to a low level, and the fifth thin-film transistor is turned off.

According to an embodiment of the present disclosure, when the input signal inputted from the first signal input terminal is at a low level, the clock signal inputted from the first clock signal input terminal is at a high level and the clock signal inputted from the second clock signal input terminal is at a low level, the eighth thin-film transistor is turned off, the first capacitor holds the high level of the first pull-up node, the voltage of the first pull-up node varies with the clock signal inputted from the first clock signal input terminal and causes the first thin-film transistor to remain being turned on, while the voltage of the second pull-up node varies with the clock signal inputted from the first clock signal input terminal and becomes to be at a high level, the second thin-film transistor is turned on, and the output of the shift register is at a high level.

According to an embodiment of the present disclosure, when the input signal inputted from the second signal input terminal is at a high level, the clock signal inputted from the first clock signal input terminal is at a low level, and the clock signal inputted from the second clock signal input terminal is at a high level, the ninth thin-film transistor is turned on, the first capacitor is discharged via the ninth thin-film transistor, the first pull-up node becomes to be at a low level, the first thin-film transistor is turned off, the third thin-film transistor is turned on, the high level signal inputted from the second clock signal input terminal charges the second capacitor via the third thin-film transistor, the first pull-down node becomes to be at a high level, the fourth thin-film transistor is turned on, so as to further ensure that the potential of the first pull-up node is pulled down, the eleventh thin-film transistor is turned on, the second pull-up node is pulled down to a low level, the second thin-film transistor is turned off, the high level signal of the first pull-down node charges the third capacitor via the sixth thin-film transistor, the second pull-down node becomes to be at a high level, the fifth thin-film transistor is turned on, and the output of the shift register becomes to be at a low level.

In addition, an embodiment of the present disclosure provides a gate driver, which comprises the above-mentioned shift registers cascaded in multiple stages, wherein, for a shift register in a certain stage, the input signal inputted from the first signal input terminal is a signal output from the gate driver of the previous stage, and the input signal inputted from the second signal input terminal is a signal output from the gate driver of the next stage.

In order to achieve the above objects, a second aspect of the present disclosure also provides a touch sensing display device comprising the above-mentioned shift register.

In addition, an embodiment of the present disclosure further provides a touch sensing electronic device, which comprises the above mentioned touch sensing display device.

In addition, an embodiment of the present disclosure further discloses a driving method of a shift register, comprising: applying a high level signal on the first clock signal input terminal, applying a low level signal on the second clock signal input terminal, applying a high level signal on the first signal input terminal, and applying a low level signal on the second signal input terminal at a time t1; applying a low level signal on the first clock signal input terminal, applying a high level signal on the second clock signal input terminal, applying a low level signal on the first signal input terminal, and applying a low level signal on the second signal input terminal at a time t2 which is later than t1 by ½ cycle of the signal inputted from the first clock signal input terminal; and applying a high level signal on the first clock signal input terminal, applying a low level signal on the second clock signal input terminal, applying a low level signal on the first signal input terminal, and applying a high level signal on the second signal input terminal at a time t3 which is later than t2 by ½ cycle of the signal inputted from the first clock signal input terminal.

DETAILED DESCRIPTION

Figure 1:
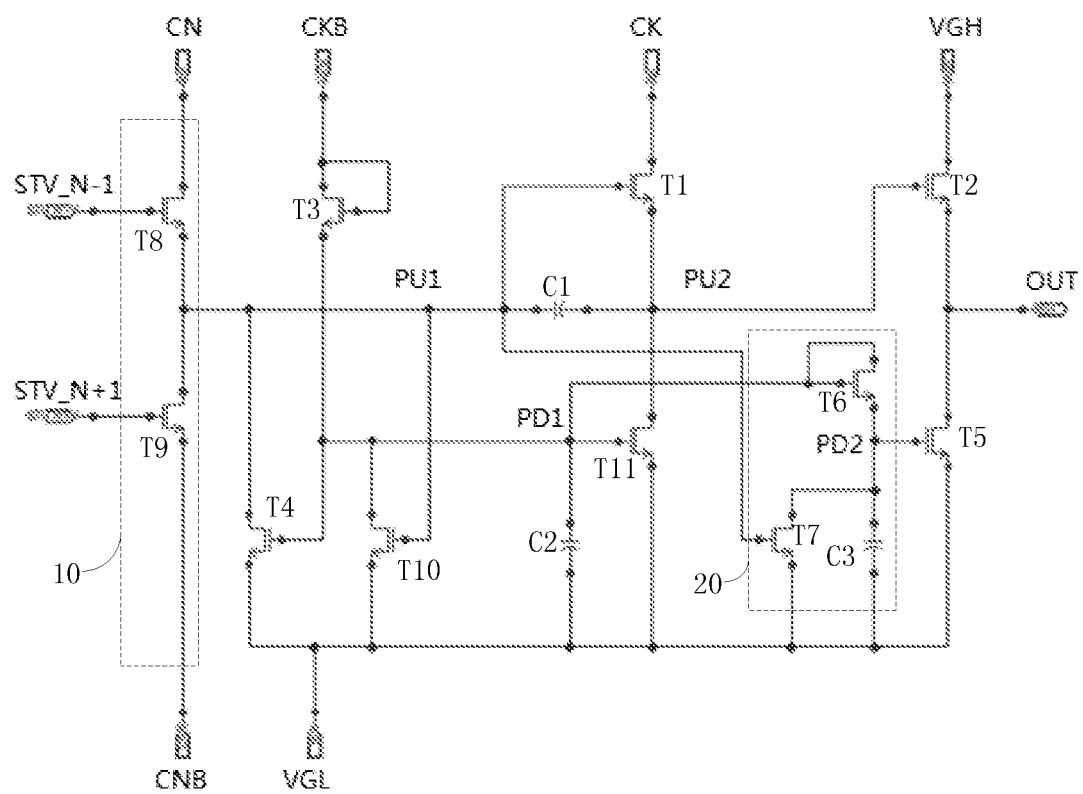
FIG. 1 is a schematic circuit diagram of a shift register of 11T3C according to an embodiment of the present disclosure.

Embodiments of the present disclosure will be described in detail below. Examples of the embodiments are illustrated in the accompanying drawings. Throughout the drawings, same or similar components or components with same or similar functions are denoted by same or similar reference numerals. The embodiments described below with reference to the accompanying drawings are exemplary and are intended to explain the present disclosure, which should not be construed as limiting the present disclosure.

Hereafter, the shift register, the touch sensing display device and the touch sensing electronic device according to embodiments of the present disclosure will be described below with reference to the accompanying drawings.

The transistors used in all embodiments of the present disclosure may be thin-film transistors, field effect transistors or other devices with the same characteristics. The transistors in the embodiments of the present disclosure are mainly used as switching transistors according to their roles in the circuit. The source and drain of the switching transistors as used here are symmetrical, so the source and drain are interchangeable. In embodiments of the present disclosure, in order to distinguish the two electrodes of a transistor except the gate, the source may be referred to as a first electrode and the drain as a second electrode. Alternatively, the drain may be referred to as the first electrode and the source as the second electrode. In addition, the transistors used in the embodiments of the present disclosure include P-type transistors and N-type transistors. The P-type transistors are turned on when the gate is at a low level and turned off when the gate is at a high level. The N-type transistors are turned on when the gate is at a high level and turned off when the gate is at a low level.

As shown in the figures, the shift register, according to an embodiment of the present disclosure comprises: a first capacitor C1, a first thin-film transistor T1, a second thin-film transistor T2 and an input control circuit 10. Hereafter, embodiments will be described with N-type transistors as an example of the thin-film transistors and with reference to the figures.

As shown in FIG. 1, a first terminal of the first capacitor C1 is connected to a first pull-up node PU1. A second terminal of the first capacitor C1 is connected to a second pull-up node PU2. The gate of the first thin-film transistor T1 is connected to the first pull-up node PU1. The source of the first thin-film transistor T1 is connected to the second pull-up node PU2. The drain of the first thin-film transistor T1 is connected to the first clock signal input terminal CK. The gate of the second thin-film transistor T2 is connected to the second pull-up node PU2. The drain of the second thin-film transistor T2 is connected to the DC high level signal terminal VGH. The source of the second thin-film transistor T2 is connected to the output terminal OUT of the shift register, i.e. may be a first signal input terminal of a shift register in a next-stage for cascaded shift registers of a touch sensing display device, such as an LCD display. The input control circuit 10 is connected with signal input terminals (i.e, the first signal input terminal INPUT and the second signal input terminal RESET) and signal control terminals (i.e, the first signal control terminal CN and the second signal control terminal CNB). The input control circuit 10 controls a voltage level of the first terminal of the first capacitor under the control of the input signals inputted from the signal input terminals and the control signals inputted from the signal control terminals, wherein the first capacitor C1 and the first thin-film transistor T1 boost the voltage on the first pull-up node PU1 so as to make the clock signal inputted from the first clock signal input terminal CK pass to the second pull-up node PU2, and enable a high level signal inputted from the DC high level signal terminal VGH to control the output of the shift register via the second thin-film transistor T2 when the voltage level of the first terminal of the first capacity is a turn-on voltage level.

That is, in the embodiment of the present disclosure, the combination of the first capacitor C1 and the first thin-film transistor T1 may realize voltage bootstrap on the PU1, so as to ensure that the clock signal inputted from the first clock signal input terminal CK can pass to the PU2. The voltage of the PU2 controls the gate of the second thin-film transistor T2, so as to ensure that the output terminal OUT of the shift register may output a high level signal. Thus, the configuration of dual PU points may reduce the influence of the fluctuation in the clock signal inputted from the first clock signal input terminal CK on the output of the shift register, ensure a stable output of the shift register, and improve circuit driving capability.

The shift register according to the embodiment of the present disclosure charges/discharges the first capacitor through the input control circuit. When the voltage level of the first terminal of the first capacity is a turn-on voltage level, the first capacitor and the first thin-film transistor boost the voltage on the first pull-up node so as to make a clock signal inputted from the first clock signal input terminal pass to the second pull-up node, and enable a high level signal inputted from the DC high level signal terminal to control the output of the shift register via the second thin-film transistor, thereby realizing the control of the output through dual pull-up nodes, and reducing the influence of the fluctuation in the clock signal inputted from the first clock signal input terminal on the output of the shift register, so as to ensure a more stable output, improved circuit driving capability and anti-noise capability. The shift register has low output noise and high stability, which may improve the excellent rate of display panels and significantly improve display effect.

According to an embodiment of the present disclosure, the shift register mentioned above further comprises: a second capacitor C2, a third thin-film transistor T3, a fourth thin-film transistor T4, a fifth thin-film transistor T5 and a potential-stabilizing unit 20, as shown in FIG. 1. The potential-stabilizing unit 20 is used to stabilize the potential on the second pull-down node PD2.

In the embodiment, a first terminal of the second capacitor C2 is connected to a first pull-down node PD1. A second terminal of the second capacitor C2 is connected to the DC low-level signal terminal VGL. The source of the third thin-film transistor T3 is connected to the first pull-down node PD1. The gate of the third thin-film transistor T3 is connected to the drain thereof and then connected to the second clock signal input terminal CKB. The drain of the fourth thin-film transistor T4 is connected to the first pull-up node PU1. The gate of the fourth thin-film transistor T4 is connected to the first pull-down node PD1. The source of the fourth thin-film transistor T4 is connected to the DC low level signal terminal VGL. The drain of the fifth thin-film transistor T5 is connected to the source of the second thin-film transistor T2. The source of the fifth thin-film transistor T5 is connected to the DC low level signal terminal VGL. The first input terminal of the potential-stabilizing unit 20 is connected to the first pull-down node PD1. The second input terminal of the potential-stabilizing unit 20 is connected to the first pull-up node PU1. The output terminal of the potential-stabilizing unit 20 is connected to the gate of the fifth thin-film transistor T5. The output terminal of the potential-stabilizing unit 20 is connected to a second pull-down node PD2. The potential-stabilizing unit 20 is configured to enable, according to the potential of the first pull-down node PD1 and the potential of the first pull-up node PU1, the second pull-down node PD2 to output a more stable potential than that output by the first pull-down node PD1, so as to control the output of the shift register via the fifth thin-film transistor.

Specifically, in an embodiment of the present disclosure, the potential stabilization unit 20 comprises a sixth thin-film transistor T6, a seventh thin-film transistor T7, and a third capacitor C3, as shown in FIG. 1. The gate of the sixth thin-film transistor T6 is connected to the drain thereof and to the first input terminal of the potential-stabilizing unit 20. The source of the sixth thin-film transistor T6 is connected to the second pull-down node PD2. The gate of the seventh thin-film transistor T7 is connected to the second input terminal of the potential-stabilizing unit 20. The source of the seventh thin-film transistor T7 is connected to the DC low level signal terminal VGL. The drain of the seventh thin-film transistor T7 is connected to the second pull-down node PD2. A first terminal of the third capacitor C3 is connected to the second pull-down node PD2. A second terminal of the third capacitor C3 is connected to the DC low-level signal terminal VGL.

That is, in the embodiment of the present disclosure, the potential on the first pull-down node PD1 is held by the second capacitor C2. Through the feedback function of T4, it can ensure that the PU1 is pulled down to a low level. Then, through the conduction function of T6 and the holding function of the third capacitor C3, the potential of the PD2 becomes more stable than that of the PD1. By adding the feedback function of T7, the potential of the PD2 becomes even more stable. The stable potential of the PD2 is used to control T5, which further improves the output stability of the output terminal OUT of the shift register.

Therefore, the shift register of the embodiment of the present disclosure controls the output of the shift register through dual PD nodes, which further improves the stability of the output of the shift register, and increases the circuit driving capability and anti-noise capability. The shift register has low output noise and high stability, and may improve the excellent rate of display panels.

According to an embodiment of the present disclosure, the input control circuit 10 comprises an eighth thin-film transistor T8 and a ninth thin-film transistor T9 as shown in FIG. 1. The gate of the eighth thin-film transistor T8 is connected to the first signal input terminal INPUT, e.g. STV_N−1. The drain of the eighth thin-film transistor T8 is connected to the first signal control terminal CN. The source of the eighth thin-film transistor T8 is connected to the first pull-up node PU1. The gate of the ninth thin-film transistor T9 is connected to the second signal input terminal RESET, e.g. STV_N+1. The source of the ninth thin-film transistor T9 is connected to the second signal control terminal CNB. The drain of the ninth thin-film transistor T9 is connected with the first pull-up node PU1 and the source of and the eighth thin-film transistor T8. In this embodiment, when the input signal inputted from the first signal input terminal STV_N−1 is at a high level and the control signal inputted from the first signal control terminal CN is at a high level, the eighth thin-film transistor T8 is turned on, the high level signal inputted from the first signal control terminal CN charges the first capacitor C1 via the eighth thin-film transistor T8, and the voltage on the first pull-up node PU1 is raised to the high level. When the input signal inputted from the second signal input terminal STV_N+1 is at a high level and the control signal inputted from the second signal control terminal CNB is at a low level, the ninth thin-film transistor T9 is turned on, the first capacitor C1 is discharged via the ninth thin-film transistor T9, and the potential on the first pull-up node PU1 is pulled down to a low level via the ninth thin-film transistor T9.

In an embodiment of the present disclosure, when the control signal inputted from the first signal control terminal CN is at a high level and the control signal inputted from the second signal control terminal CNB is at a low level, the shift register performs forward scan. When the control signal inputted from the first signal control terminal is at a low level and the control signal inputted from the second signal control terminal is at a high level, the shift register performs reverse scan. The manner for performing the forward/reverse scan is controlled by the high/low levels inputted from the first signal control terminal and the second signal control terminal, which makes the shift register more universal and has a wide range of applications.

That is, as shown in FIG. 1, the two clock signal input terminals are the first clock signal input terminal CK and the second clock signal input terminal CKB. The two input signal terminals are the first signal input terminal STV_N−1 and the second signal input terminal STV_N+1. The two control signal input terminals are the first control signal input terminal CN and the second control signal input terminal CNB. VGH, VGL, CN and CNB are four terminals with DC signals inputted therefrom. In the embodiment, the clock signal inputted from the first clock signal input terminal CK and the clock signal inputted from the second clock signal input terminal CKB differ from each other by ½ cycle. The control signal inputted from the first control signal input terminal CN and the control signal inputted from the second control signal input terminal CNB are used to control whether the forward scan or the reverse scan should be performed. If CN is at the high level and CNB is at the low level, the forward scan should be performed; and otherwise, the reverse scan should be performed. STV_N−1 and STV_N+1 are input signals for a forward/reverse scan. And, the principles for forward and reverse scans are the same.

It can be appreciated that the performance of the shift register, which is a driving circuit of a display device, may directly affect the performance of the liquid crystal displays. Therefore, the improvement and enhancement of the driving performance of a shift register has become the key technology in the liquid crystal panel industry. Noise reduction and stability improvement are always the key points in shift register circuit design. The present disclosure proposes to use a shift register with dual PU nodes and dual PD nodes to drive the gate of the LCD display, which may significantly improve circuit driving capability and anti-noise capability, and may ensure a more stable output. The shift register has low output noise and high stability, which may improve the excellent rate of LCD display panels.

In an embodiment of the present disclosure, as shown in FIG. 1, the shift register further comprises: a tenth thin-film transistor T10 and an eleventh thin-film transistor T11. The gate of the tenth thin-film transistor T10 is connected to the first Pull-up node PU1. The drain of the tenth thin-film transistor T10 is connected to the first pull-down node PD1. The source of the tenth thin-film transistor T10 is connected to the DC low-level signal terminal VGL. The drain of the eleventh thin-film transistor T11 is connected to the second pull-up node PU2. The gate of the eleventh thin-film transistor T11 is connected to the first pull-down node PD1. The source of the eleventh thin-film transistor T11 is connected to the DC low-level signal terminal VGL.

That is, the present disclosure propose to drive the gate of the LCD display by a shift register composed of 11 thin-film transistors and 3 capacitors (referred to as 11T3C). In this embodiment, the potential bootstrap on the PU1 can be realized by the combination of C1 and T1, in order to ensure that the conduction of the CK signal to the PU2. The potential of the PU2 controls the gate of T2, so as to ensure a high level output on the OUT terminal. Therefore, the design of dual PU points can reduce the influence of the fluctuation in the CK signal on the output of the shift register. In addition, the potential on the PD1 is held by the second capacitor C2. Through the feedback function of T4 and T11, it can further ensure that the PU1 and PU2 are pulled down to a low level. Then, through the conduction function of T6 and the holding function of the third capacitor C3, the potential of the PD2 may become more stable than that of PD1. By adding the feedback function of T7, the potential of PD2 becomes even more stable. The stable potential of PD2 is used to control T5, which further improves the output stability of the output terminal OUT.

It should be noted that the shift register of the embodiments of the present disclosure may be one stage of a gate driver of a LCD display. The gate driver of the LCD display may have multi-stages of shift registers where the shift registers are cascaded.

That is, when the shift registers is cascaded in multiple stages, the input signal inputted from the first signal input terminal is a signal output from the gate driver of the previous stage, and the input signal inputted from the second signal input terminal is a signal output from the gate driver of the next stage.

Figure 2:
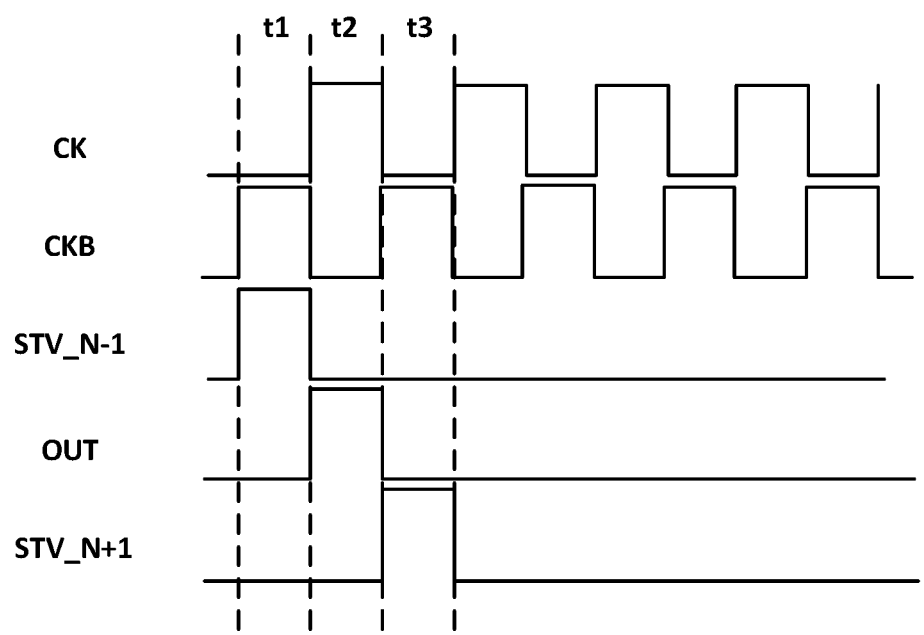
FIG. 2 is a corresponding timing diagram of the shift register of 11T3C according to an embodiment of the present disclosure.

According to an embodiment of the present disclosure, as shown in FIG. 2, when the clock signal inputted from the first clock signal input terminal CK is at a high level, the clock signal inputted from the second clock signal input terminal CKB is at a low level. When the clock signal inputted from the second clock signal input terminal CKB is at a high level, the clock signal inputted from the first clock signal input terminal CK is at a low level.

That is, the clock signal inputted from the first clock signal input terminal CK and the clock signal inputted from the second clock signal input terminal CKB differ from each other by ½ cycle.

Specifically, in an embodiment of the present disclosure, as shown in FIG. 1 and FIG. 2, when the control signal inputted from the first signal control terminal CN is at a high level and the control signal inputted from the second signal control terminal CNB is at a low level, forward scan is performed. The following description will use forward scan as an example. FIG. 2 shows a corresponding timing diagram of the shift register of 11T3C. At this time, the control signal inputted from the first signal control terminal CN is at a high level and the control signal inputted from the second signal control terminal CNB is at a low level, the first signal input terminal STV_N−1 receives an input signal from the previous stage, and the second signal input terminal STV_N+1 receives an input signal from the next stage.

In the embodiment, at time t1, the input signal inputted from the first signal input terminal STV_N−1 is at a high level, the clock signal inputted from the first clock signal input terminal CK is at a low level and the clock inputted from the second clock signal input terminal CKB is at a high level. The first pull-up node PU1 becomes to be at a high level, the first thin-film transistor T1 is turned on, the second pull-up node PU2 is consistent with the clock signal inputted from the first clock signal input terminal CK, i.e., at a low level, the second thin-film transistor T2 is turned off, the output of the shift register is held at a low level, the tenth thin-film transistor T10 is turned on, the first pull-down node PD1 is connected to the DC low level signal terminal VGL, the second capacitor C2 is discharged, the potential on the first pull-down node PD1 is pulled down to the low level, the eleventh thin-film transistor T11 is turned off, the seventh thin-film transistor T7 is turned on, the second pull-down node PD2 is connected to the DC low level signal terminal VGL, the third capacitor C3 is discharged, the potential on the second pull-down node PD2 is pulled down to a low level, and the fifth thin-film transistor T5 is turned off.

That is, T8 is turned on, the high level signal inputted from CN charges C1 via T8, PU1 is raised to a high level, T1 is turned on, the low level signal inputted from CK is connected to PU2, PU2 is consistent with CK, i.e., held at a low level, T2 is turned off, the OUT terminal remains at a low level, T10 is turned on, PD1 is connected to VGL, the capacitor C2 is discharged, the potential of PD1 is pulled down to a low level, T11 is turned off, T7 is turned on, PD2 is connected to the VGL, capacitor C3 is discharged, the potential of PD2 is pulled down to a low level, and T5 is turned off, when the input signal inputted from the first signal input terminal STV_N−1 is at a high level, the clock signal inputted from the first clock signal input terminal CK is at a low level and the clock signal inputted from the second clock signal input terminal CKB is at a high level.

At time t2, the input signal inputted from the first signal input terminal STV_N−1 is at a low level, the clock signal inputted from the first clock signal input terminal CK is at a high level, and the clock signal inputted from the second clock signal input terminal CKB is at a low level. The eighth thin-film transistor T8 is turned off, the first capacitor C1 holds the high level of the first pull-up node PU1, the voltage level of the first pull-up node PU1 varies with that of the clock signal inputted from the clock signal input terminal CK, the first thin-film transistor T1 remains being turned on, the voltage level of the second pull-up node PU2 becomes to be at a high level following the clock signal inputted from the first clock signal input terminal CK, the second thin-film transistor T2 is turned on, and the output of the shift register is at a high level.

That is, when the input signal inputted from the first signal input terminal STV_N−1 is at a low level, the clock signal inputted from the first clock signal input terminal CK is at a high level, and the clock signal inputted from the second clock signal input terminal CKB is at a low level, T8 is turned off. The capacitor C1 effectively ensures the high potential of the PU1. The potential of the PU1 varies with that of the clock signal inputted from the CK, and the occurrence of bootstrap effectively ensures the on state of T1, the potential of the PU2 varies with that of the clock signal inputted from CK to become high, T2 is turned on, and the OUT terminal outputs a high level. That is, the potential bootstrap on the PU1 can be realized by the combination of C1 and T1, in order to ensure that the conduction of the CK signal to the PU2. The potential of the PU2 controls the gate of T2, so as to ensure a high level output on the OUT terminal. Therefore, the design of dual PU points can reduce the influence of the fluctuation in the CK signal on the output on the OUT terminal.

At time t3, the input signal inputted from the second signal input terminal STV_N+1 is at a high level, the clock signal inputted from the first clock signal input terminal CK is at a low level and the clock signal inputted from the second clock signal input terminal CKB is at a high level. The ninth thin-film transistor T9 is turned on, the first capacitor C1 is discharged via the ninth thin-film transistor T9, the first pull-up node PU1 becomes to be at a low level, the first thin-film transistor T1 is turned off, the third thin-film transistor T3 is turned on, the high level signal inputted from the second clock signal input terminal CKB charges the second capacitor C2 via the third thin-film transistor T3, the first pull-down node PD1 becomes to be at a high level, the fourth thin-film transistor T4 is turned on, which further ensures that the potential of the pull-up node PU1 is pulled down, the eleventh thin-film transistor T11 is turned on, the second pull-up node PU2 is pulled down to a low level, the second thin-film transistor T2 is turned off, the high level of the first pull-down node PD1 charges the third capacitor C3 via the sixth thin-film transistor T6, the second pull-down node PD2 becomes to be at a high level, the fifth thin-film transistor T5 is turned on, and the output of the shift register is at a low level.

That is, T9 is turned on, C1 is discharged via T9 and connected to CNB, the potential of PU1 is pulled down, T1 is turned off, T3 is turned on, the high level signal inputted from CKB charges C2 via T3, the potential of PD1 is pulled up, T4 is turned on, which further ensures that the potential of PU1 is pulled down, T11 is turned on, the potential of PU2 is pulled down to a low level, T2 is turned off. The high potential of PD1 charges C3 via T6, the potential of PD2 is raised to a high level, T5 is turned on, and the OUT terminal outputs a low level signal, when the input signal inputted from the second signal input terminal STV_N+1 is at a high level, the clock signal inputted from the first clock signal input terminal CK is at a low level, and the clock signal inputted from the second clock signal input terminal CKB is at a high level. In other words, the potential of PD1 is held by the capacitor C2. Through the feedback function of T4 and T11, it can further ensure that the PU1 and PU2 are pulled down to a low level. Through the conduction function of T6 and the holding function of the third capacitor C3, the potential of the PD2 may become more stable than that of the PD1. By adding the feedback function of T7, the potential of PD2 becomes even more stable. The stable potential of PD2 is used to control T5, which further improves the output stability of the OUT terminal.

Figure 3:
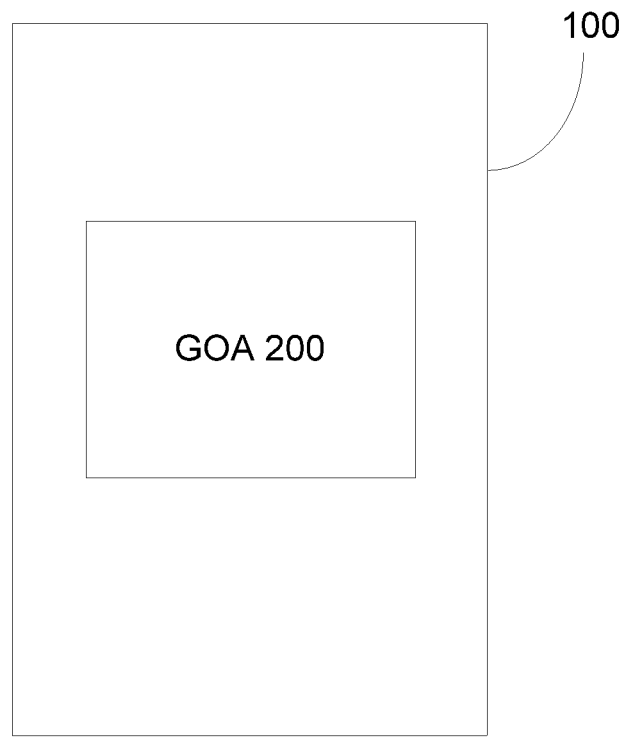
FIG. 3 is a block diagram of a touch sensing display device according to an embodiment of the present disclosure.

As shown in FIG. 3, an embodiment of the present disclosure further provides a touch sensing display device 100, which comprises the shift register 200 described in the above embodiments.

The touch sensing display device 100 may be a liquid crystal display or other devices with touch sensing display function.

With the above mentioned shift register, the touch sensing display device according to an embodiment of the present disclosure can not only control the output of the shift register by dual pull-up nodes (i.e. dual PU points), thereby reducing the influence of the fluctuation in the clock signal inputted from the first clock signal input terminal on the output of the shift register, and achieving a more stable output, but also control the output of the shift register by dual pull-down nodes (i.e. dual PD points), thereby further improving stability of the output of the shift register, improving circuit driving capability and anti-noise capability. The shift register has low output noise and high stability, which may improve the excellent rate of display panels, significantly improve display effect, and fully satisfy the user's need.

Figure 4:
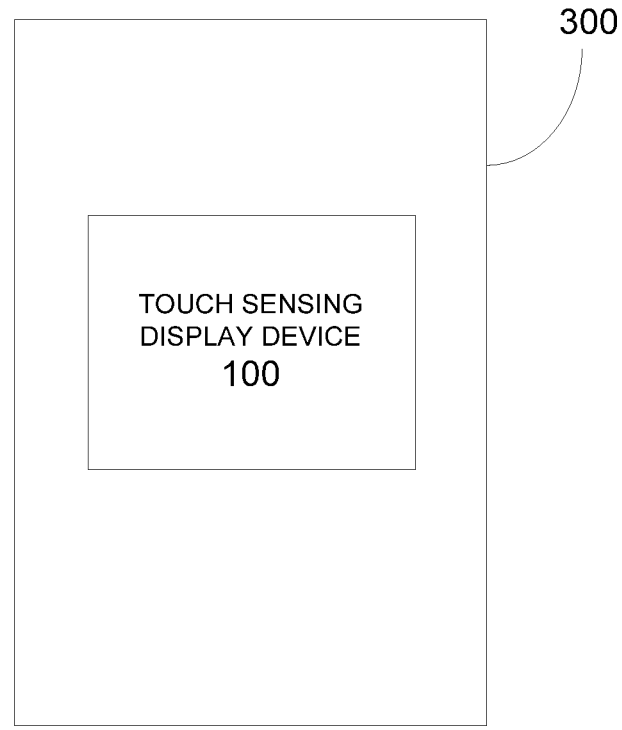
FIG. 4 is a block diagram of a touch sensing electronic device according to an embodiment of the present disclosure.

In addition, as shown in FIG. 4, an embodiment of the present disclosure further provides a touch sensing electronic device 300, which comprises the above mentioned touch sensing display device 100. The touch sensing electronic device 300 may be a mobile phone with a touch sensing screen, a tablet, or the like.

The touch sensing electronic device according to the embodiment of the present disclosure adopts the above mentioned touch sensing display device, which has good touch sensing display effect, fast response, high stability, high anti-noise capability and improved user experience.

Figure 5:
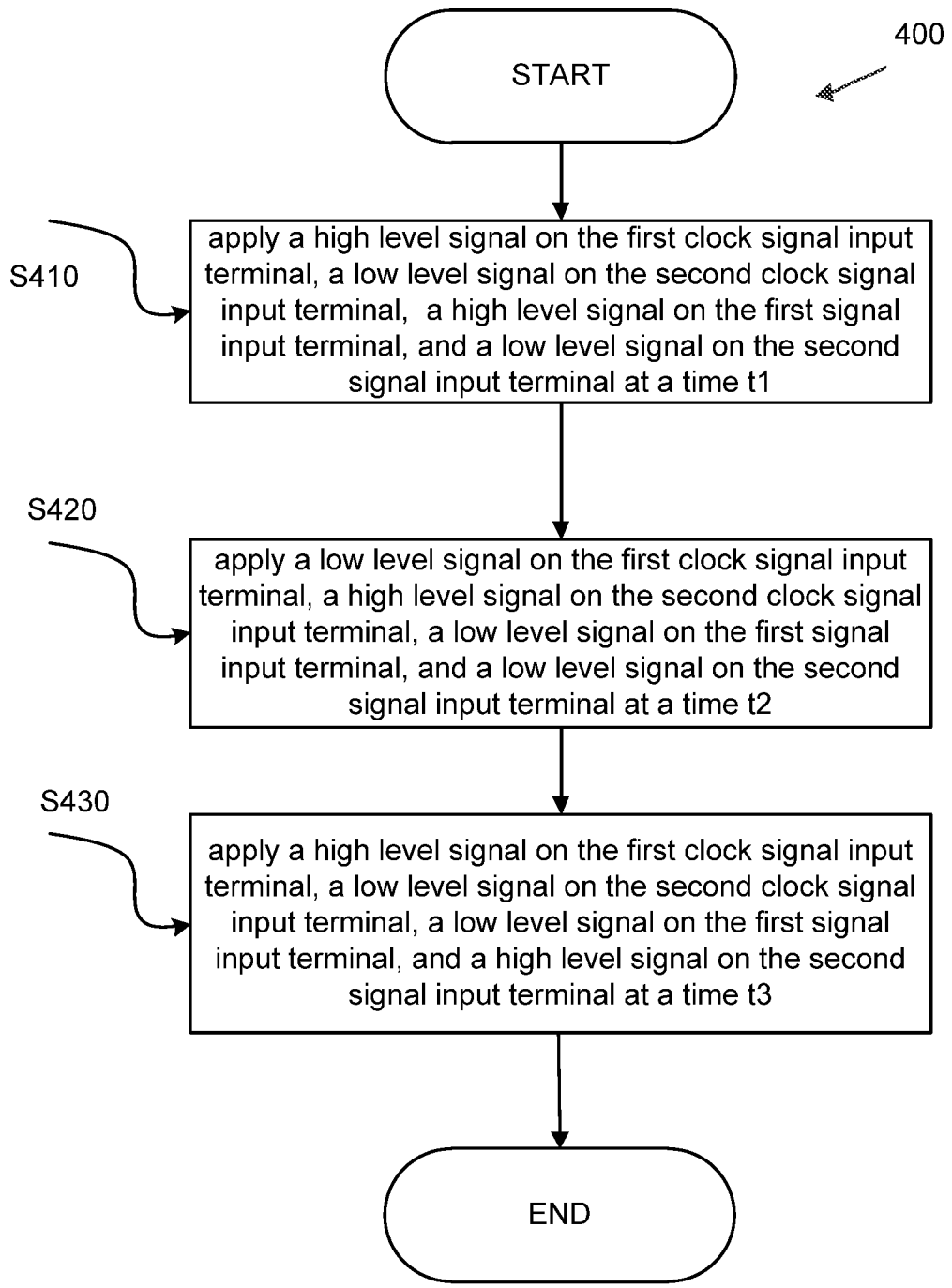
FIG. 5 is a flow chart of a driving method according to an embodiment of the present disclosure.

As shown in FIG. 5, an embodiment of the present disclosure further provides a driving method 500 that drives the shift register according to embodiments of the present disclosure. As shown in FIG. 5, the method 500 comprises S410 of applying a high level signal on the first clock signal input terminal, applying a low level signal on the second clock signal input terminal, applying a high level signal on the first signal input terminal, and applying a low level signal on the second signal input terminal at a time t1; S420 of applying a low level signal on the first clock signal input terminal, applying a high level signal on the second clock signal input terminal, applying a low level signal on the first signal input terminal, and applying a low level signal on the second signal input terminal at a time t2 which is later than t1 by ½ cycle of the signal inputted from the first clock signal input terminal; and S430 of applying a high level signal on the first clock signal input terminal, applying a low level signal on the second clock signal input terminal, applying a low level signal on the first signal input terminal, and applying a high level signal on the second signal input terminal at a time t3 which is later than t2 by ½ cycle of the signal inputted from the first clock signal input terminal.

In the description of the present disclosure, it should be understood that the orientation or position relationship indicated by the terms, such as longitudinal, transverse, length, width, thickness, upper, lower, front, left, right, vertical, horizontal, top, bottom, inner, outer, clockwise, counter-clockwise, axial, radial, circumferential, and etc., is the orientation or position relationship based on those shown in the figures. These terms are used merely for the convenience and simplification of the description of the present disclosure, but not to indicate or imply that the referenced device or element must have a particular orientation, be constructed and operated in a particular orientation, and thus should not be construed as limiting the disclosure.

In addition, the terms "first" and "second" are used for descriptive purposes only and are not to be construed as indicating or implying relative importance or implicitly indicating the number of indicated technical features. Thus, features with a prefix of "first" or "second" may explicitly or implicitly indicate that at least one such feature is comprised. In the description of the present disclosure, the expression "a plurality of" means at least two, for example, two, three, and etc., unless expressly limited otherwise.

In the present disclosure, the terms "mounting," "connecting," "connecting," "fixing" and the like should be broadly understood unless expressly stated and limited otherwise. For example, they may indicate fixed connection or detachable connection or be integral with each other. They may refer to a mechanical connection or an electrical connection. They may refer to a direct connection or an indirect connection through an intermediary medium, and may refer to be an interconnection between two elements or an interaction between two elements, unless otherwise specified or limited. For those skilled in the art, the specific meanings of the above terms in the present disclosure may be understood based on specific situations.

In the present disclosure, unless expressly stated or limited otherwise, the first feature being over or below a second feature may indicate that the first and second features are in direct contact with each other, or be indirectly contact through an intermediate. Furthermore, the first feature being over, on, or above a second feature may indicate that the first feature is directly above or obliquely above the second feature, or merely indicate that the horizontal height of the first feature is greater than that of the second feature. The first feature being below, under and beneath the second feature may indicate that the first feature is directly below or obliquely below the second feature, or simply indicate that the horizontal height of the first feature is less than that of the second feature.

In the description of the specification, the description with reference to the terms "one embodiment," "some embodiments," "an example," "a specific example," or "some examples" and the like means that the specific structures, materials, or features described in connection with the embodiment or example are included in at least one embodiment or example of the present disclosure. In the present specification, an illustrated expression of the above terms does not necessarily refer to the same embodiment or example. Furthermore, the particular features, structures, materials, or characteristics described may be combined in any suitable manner in any one or more of the embodiments or examples. In addition, different embodiments or examples described in this specification and features of different embodiments or examples may be combined and incorporated by those skilled in the art without mutual contradiction.

Although the embodiments of the disclosure have been shown and described above, it should be understood that the above embodiments are merely exemplary and should not be construed as limiting the disclosure. Those skilled in the art may contemplate changes, modifications, replacements, and variations to the embodiments within the scope of the disclosure.

I claim:

1. A shift register comprising:
   a first capacitor with a first terminal connected to a first pull-up node and a second terminal connected to a second pull-up node;
   a first thin-film transistor with a gate connected to the first pull-up node, a first electrode connected to the second pull-up node, and a second electrode connected to a first clock signal input terminal;
   a second thin-film transistor with a gate connected to the second pull-up node, a first electrode connected to an output of the shift register, and a second electrode connected to a DC high level signal terminal; and
   an input control circuit connected to a first signal input terminal and a first signal control terminal, configured to control a voltage level of the first terminal of the first capacitor under the control of a first input signal inputted from the first signal input terminal and a first control signal inputted from the first signal control terminal,
   wherein, the first capacitor and the first thin-film transistor boost the voltage on the first pull-up node so as to make a clock signal inputted from the first clock signal input terminal pass to the second pull-up node, and the second pull-up node enables a high level signal inputted from the DC high level signal terminal to control the output of the shift register via the second thin-film transistor when the voltage level of the first terminal of the first capacitor is a turn-on voltage level,
   wherein the shift register further comprises:
      a second capacitor with a first terminal connected to a first pull-down node and a second terminal connected to a DC low level signal terminal;
      a third thin-film transistor with a first electrode connected to the first pull-down node, and a gate and a second electrode connected with each other and to a second clock signal input terminal;
      a fourth thin-film transistor with a first electrode connected to the DC low level signal terminal, a second electrode connected to the first pull-up node, and a gate connected to the first pull-down node;
      a fifth thin-film transistor with a first electrode connected to the DC low level signal terminal and a second electrode connected to the first electrode of the second thin-film transistor; and
      a potential-stabilizing unit with a first input terminal connected to the first pull-down node, a second input terminal connected to the first pull-up node, and an output terminal connected to a gate of the fifth thin-film transistor and used as a second pull-down node, the potential-stabilizing unit being configured to enable, according to the potential of the first pull-down node and the potential of the first pull-up node, the second pull-down node to output a more stable potential than that output by the first pull-down node, so as to control the output of the shift register via the fifth thin-film transistor.

2. The shift register according to claim 1, wherein the potential-stabilizing unit comprises:
   a sixth thin-film transistor with a first electrode connected to the second pull-down node, and a gate and a second electrode connected with each other and used as the first input terminal of the potential-stabilizing unit;
   a seventh thin-film transistor with a gate used as the second input terminal of the potential-stabilizing unit, a first electrode connected to a DC low level signal terminal, and a second electrode connected to the second pull-down node; and
   a third capacitor with a first terminal connected to the second pull-down node and a second terminal connected to the DC low level signal terminal.

3. The shift register according to claim 2, wherein the input control circuit comprises:
   an eighth thin-film transistor with a gate connected to the first signal input terminal, a first electrode connected to the first pull-up node, and a second electrode connected to the first signal control terminal, and configured to charge the first capacitor under control of the first input signal inputted from the first signal input terminal and the first control signal inputted from the first signal control terminal; and
   a ninth thin-film transistor with a gate connected to a second signal input terminal, a first electrode connected to a second signal control terminal, and a second electrode connected to the first pull-up electrode and the first electrode of the eighth thin-film transistor and configured to pull down the first pull-down node to a low level under the control of a second input signal inputted from the second signal input terminal and a second control signal inputted from the second signal control terminal.

4. The shift register according to claim 3, wherein,
   when the first control signal inputted from the first signal control terminal is at a high level and the second control signal inputted from the second signal control terminal is at a low level, the shift register performs forward scan; and
   when the first control signal inputted from the first signal control terminal is at a low level and the second control signal inputted from the second signal control terminal is at a high level, the shift register performs reverse scan.

5. The shift register according to claim 3, further comprising:
- a tenth thin-film transistor with a gate connected to the first pull-up node, a first electrode connected to the DC low level signal terminal, and a second electrode connected to the first pull-down node; and
- an eleventh thin-film transistor with a first electrode connected to the DC low level signal terminal, a second electrode connected to the second pull-up node, and a gate connected to the first pull-down node.

6. The shift register according to claim 5, wherein,
- when the clock signal inputted from the first clock signal input terminal is at a high level, the clock signal inputted from the second clock signal input terminal is at a low level; and
- when the clock signal inputted from the second clock signal input terminal is at a high level, the clock signal inputted from the first clock signal input terminal is at a low level.

7. The shift register according to claim 5, wherein, in a state where the first control signal inputted from the first signal control terminal is at a high level and the second control signal inputted from the second signal control terminal is at a low level:
- when the first input signal inputted from the first signal input terminal is at a high level, the clock signal inputted from the first clock signal input terminal is at a low level and the clock signal inputted from the second clock signal input terminal is at a high level, the first pull-up node becomes a high level, the first thin-film transistor is turned on, the second pull-up node and the clock signal inputted from the first clock signal input terminal remain at a low level, the second thin-film transistor is turned off, and the output of the shift register remains at a low level; and
- the tenth thin-film transistor is turned on, the first pull-down node is connected to the DC low level signal terminal, the second capacitor is discharged, the potential of the first pull-down node is pull down to a low level, the eleventh thin-film transistor is turned off, the seventh thin-film transistor is turned on, the second pull-down node is connected to the DC low level signal terminal, the third capacitor is discharged, the potential of the second pull-down node is pull down to the low level, and the fifth thin-film transistor is turned off.

8. The shift register according to claim 7, wherein, when the first input signal inputted from the first signal input terminal is at a low level, the clock signal inputted from the first clock signal input terminal is at a high level and the clock signal inputted from the second clock signal input terminal is at a low level, the eighth thin-film transistor is turned off, the first capacitor holds the high level of the first pull-up node, the voltage of the first pull-up node varies with the clock signal inputted from the first clock signal input terminal and causes the first thin-film transistor to remain being turned on, while the voltage of the second pull-up node varies with the clock signal inputted from the first clock signal input terminal and becomes a high level, the second thin-film transistor is turned on, and the output of the shift register is at a high level.

9. The shift register according to claim 8, wherein, when the second input signal inputted from the second signal input terminal is at a high level, the clock signal inputted from the first clock signal input terminal is at a low level, and the clock signal inputted from the second clock signal input terminal is at a high level, the ninth thin-film transistor is turned on, the first capacitor is discharged via the ninth thin-film transistor, the first pull-up node becomes a low level, the first thin-film transistor is turned off, the third thin-film transistor is turned on, the high level signal inputted from the second clock signal input terminal charges the second capacitor via the third thin-film transistor, the first pull-down node becomes a high level, the fourth thin-film transistor is turned on, so as to further ensure that the potential of the first pull-up node is pulled down, the eleventh thin-film transistor is turned on, the second pull-up node is pulled down to a low level, the second thin-film transistor is turned off, the high level of the first pull-down node charges the third capacitor via the sixth thin-film transistor, the second pull-down node becomes a high level, the fifth thin-film transistor is turned on, and the output of the shift register becomes a low level.

10. A gate driver, comprising multiple cascaded shift registers according to claim 1, wherein, for a shift register in a certain stage, the first input signal inputted from the first signal input terminal is a signal output from the gate driver of the previous stage, and the second input signal inputted from the second signal input terminal is a signal output from the gate driver of the next stage.

11. A driving method of a shift register, the shift register comprising:
- a first capacitor with a first terminal connected to a first pull-up node and a second terminal connected to a second pull-up node;
- a first thin-film transistor with a gate connected to the first pull-up node, a first electrode connected to the second pull-up node, and a second electrode connected to a first clock signal input terminal;
- a second thin-film transistor with a gate connected to the second pull-up node, a first electrode connected to an output of the shift register, and a second electrode connected to a DC high level signal terminal; and
- a second capacitor with a first terminal connected to a first pull-down node and a second terminal connected to a DC low level signal terminal;
- a third thin-film transistor with a first electrode connected to the first pull-down node, and a gate and a second electrode connected with each other and to a second clock signal input terminal;
- a fourth thin-film transistor with a first electrode connected to the DC low level signal terminal, a second electrode connected to the first pull-up node, and a gate connected to the first pull-down node;
- a fifth thin-film transistor with a first electrode connected to the DC low level signal terminal and a second electrode connected to the first electrode of the second thin-film transistor; and
- a potential-stabilizing unit with a first input terminal connected to the first pull-down node, a second input terminal connected to the first pull-up node, and an output terminal connected to a gate of the fifth thin-film transistor and used as a second pull-down node,
- an eighth thin-film transistor with a gate connected to the first signal input terminal, a first electrode connected to the first pull-up node, and a second electrode connected to the first signal control terminal, and configured to charge the first capacitor under control of the first input signal inputted from the first signal input terminal and the first control signal inputted from the first signal control terminal; and
- a ninth thin-film transistor with a gate connected to a second signal input terminal, a first electrode connected to a second signal control terminal, and a second electrode connected to the first pull-up electrode and the first electrode of the eighth thin-film transistor, and configured to pull down the first pull-down node to a low level under the control of a second input signal inputted from the second signal input terminal and a second control signal inputted from the second signal control terminal, wherein the driving method comprises:

applying a high level signal on the first clock signal input terminal, applying a low level signal on the second clock signal input terminal, applying a high level signal on the first signal input terminal, and applying a low level signal on the second signal input terminal at a time t1;

applying a low level signal on the first clock signal input terminal, applying a high level signal on the second clock signal input terminal, applying a low level signal on the first signal input terminal, and applying a low level signal on the second signal input terminal at a time t2 which is later than the time t1 by ½ cycle of the signal inputted from the first clock signal input terminal; and applying a high level signal on the first clock signal input terminal, applying a low level signal on the second clock signal input terminal, applying a low level signal on the first signal input terminal, and applying a high level signal on the second signal input terminal at a time t3 which is later than time t2 by ½ cycle of the signal inputted from the first clock signal input terminal.

12. The driving method of claim 11, wherein:

when the first control signal inputted from the first signal control terminal is at a high level and the second control signal inputted from the second signal control terminal is at a low level, the shift register performs forward scan; and when the first control signal inputted from the first signal control terminal is at a low level and the second control signal inputted from the second signal control terminal is at a high level, the shift register performs reverse scan.

13. The driving method of claim 11, wherein:

when the clock signal inputted from the first clock signal input terminal is at a high level, the clock signal inputted from the second clock signal input terminal is at a low level; and when the clock signal inputted from the second clock signal input terminal is at a high level, the clock signal inputted from the first clock signal input terminal is at a low level.

14. The driving method of claim 11, wherein the shift register further comprises:

a tenth thin-film transistor with a gate connected to the first pull-up node, a first electrode connected to the DC low level signal terminal, and a second electrode connected to the first pull-down node; and an eleventh thin-film transistor with a first electrode connected to the DC low level signal terminal, a second electrode connected to the second pull-up node, and a gate connected to the first pull-down node, and in a state where the first control signal inputted from the first signal control terminal is at a high level and the second control signal inputted from the second signal control terminal is at a low level:

when the first input signal inputted from the first signal input terminal is at a high level, the clock signal inputted from the first clock signal input terminal is at a low level and the clock signal inputted from the second clock signal input terminal is at a high level, the first pull-up node becomes a high level, the first thin-film transistor is turned on, the second pull-up node and the clock signal inputted from the first clock signal input terminal remain at a low level, the second thin-film transistor is turned off, the output of the shift register remains at a low level; and the tenth thin-film transistor is turned on, the first pull-down node is connected to the DC low level signal terminal, the second capacitor is discharged, the potential of the first pull-down node is pull down to a low level, the eleventh thin-film transistor is turned off, the seventh thin-film transistor is turned on, the second pull-down node is connected to the DC low level signal terminal, the third capacitor is discharged, the potential of the second pull-down node is pull down to the low level, and the fifth thin-film transistor is turned off.

15. The driving method according to claim 11, wherein, in a state where the first control signal inputted from the first signal control terminal is at a high level and the second control signal inputted from the second signal control terminal is at a low level:

when the first input signal inputted from the first signal input terminal is at a low level, the clock signal inputted from the first clock signal input terminal is at a high level and the clock signal inputted from the second clock signal input terminal is at a low level, the eighth thin-film transistor is turned off, the first capacitor holds the high level of the first pull-up node, the voltage of the first pull-up node varies with the clock signal inputted from the first clock signal input terminal and causes the first thin-film transistor to remain being turned on, while the voltage of the second pull-up node varies with the clock signal inputted from the first clock signal input terminal and becomes a high level, the second thin-film transistor is turned on, and the output of the shift register is at a high level.

16. The driving method according to claim 11, wherein the potential-stabilizing unit comprises:

a sixth thin-film transistor with a first electrode connected to the second pull-down node, and a gate and a second electrode connected with each other and used as the first input terminal of the potential-stabilizing unit;

a seventh thin-film transistor with a gate used as a second input terminal of the potential-stabilizing unit, a first electrode connected to a DC low level signal terminal, and a second electrode connected to the second pull-down node; and a third capacitor with a first terminal connected to the second pull-down node and a second terminal connected to the DC low level signal terminal, wherein when the second input signal inputted from the second signal input terminal is at a high level, the clock signal inputted from the first clock signal input terminal is at a low level, and the clock signal inputted from the second clock signal input terminal is at a high level, the ninth thin-film transistor is turned on, the first capacitor is discharged via the ninth thin-film transistor, the first pull-up node becomes a low level, the first thin-film transistor is turned off, the third thin-film transistor is turned on, the high level signal inputted from the second clock signal input terminal charges the second capacitor via the third thin-film transistor, the first pull-down node becomes a high level, the fourth thin-film transistor is turned on, so as to further ensure that the potential of the first pull-up node is pulled down, the eleventh thin-film transistor is turned on, the second pull-up node is pulled down to a low level, the second thin-film transistor is turned off, the high level of the first pull-down node charges the third capacitor via the sixth thin-film transistor, the second pull-down node becomes a high level, the fifth thin-film transistor is turned on, and the output of the shift register becomes a low level.

\* \* \* \* \*